United States Patent
Kwon

(10) Patent No.: US 9,633,314 B2
(45) Date of Patent: Apr. 25, 2017

(54) MULTI-QUBIT COUPLING STRUCTURE

(71) Applicant: SAMSUNG ELECTRONICS CO., LTD., Suwon-si (KR)

(72) Inventor: Hyeokshin Kwon, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/952,570

(22) Filed: Nov. 25, 2015

(65) Prior Publication Data

US 2016/0148112 A1    May 26, 2016

(30) Foreign Application Priority Data

Nov. 25, 2014   (KR) .................. 10-2014-0165502

(51) Int. Cl.
| | |
|---|---|
| *G06N 99/00* | (2010.01) |
| *H01L 27/18* | (2006.01) |
| *H01L 39/22* | (2006.01) |

(52) U.S. Cl.
CPC ........... *G06N 99/002* (2013.01); *H01L 27/18* (2013.01); *H01L 39/223* (2013.01)

(58) Field of Classification Search
CPC ........ G06N 99/002; H01L 39/02; H01L 39/22
USPC .......................................................... 257/31
See application file for complete search history.

(56) References Cited

U.S. PATENT DOCUMENTS

| | | | |
|---|---|---|---|
| 7,253,654 B2 | 8/2007 | Amin | |
| 7,268,576 B2 | 9/2007 | Amin | |
| 7,880,529 B2 | 2/2011 | Amin | |
| 7,898,282 B2 | 3/2011 | Harris et al. | |
| 8,102,185 B2 | 1/2012 | Johansson et al. | |
| 8,174,305 B2 | 5/2012 | Harris | |
| 8,738,105 B2 | 5/2014 | Berkley et al. | |
| 2002/0180006 A1 | 12/2002 | Franz et al. | |
| 2005/0062072 A1 | 3/2005 | Yamamoto et al. | |
| 2013/0029848 A1* | 1/2013 | Gonzalez ............. | G06N 99/002 505/210 |
| 2014/0246652 A1* | 9/2014 | Abraham ................ | H01L 28/82 257/31 |
| 2015/0380631 A1* | 12/2015 | Taylor .................. | H01L 39/025 257/31 |

FOREIGN PATENT DOCUMENTS

JP          4535701 B2        9/2010

OTHER PUBLICATIONS

A.O. Niskanen et al; "Quantum Coherent Tunable Coupling of Superconducting Qubits"; Science; vol. 316; No. 723; May 4, 2007; pp. 723-726; 5 pgs. total.

A.J. Berkley et al; "Entangled Macroscopic Quantum States in Two Superconducting Qubits"; Science; vol. 300; Jun. 6, 2003; pp. 1548-1550; 3 pgs. total.

* cited by examiner

*Primary Examiner* — Kenneth Parker
*Assistant Examiner* — Warren H Kilpatrick
(74) *Attorney, Agent, or Firm* — Sughrue Mion, PLLC

(57) ABSTRACT

A quantum qubit coupling structure is provided. The quantum qubit coupling structure includes a plurality of qubits and a variable capacitor electrically connected between the plurality of qubits to vary coupling constants of the plurality of qubits.

15 Claims, 4 Drawing Sheets

MULTI-QUBIT COUPLING STRUCTURE

CROSS REFERENCE TO RELATED APPLICATION

This application claims priority from Korean Patent Application No. 10-2014-0165502, filed on Nov. 25, 2014, in the Korean Intellectual Property Office, the disclosure of which is incorporated herein in its entirety by reference.

BACKGROUND

1. Field

The present disclosure relates to a multi-qubit coupling structure.

2. Description of the Related Art

A quantum bit, (qubit), is a basic unit of information in quantum computers. A qubit may indicate at least two different quantities and may be an actual physical device in which information is stored or may be a unit of information extracted from a physical qubit device.

Conventionally, classical information storage devices encode two different states classified with the labels of "0" and "1". In this case, a quantity of coding a bit state is determined based on the laws of classical physics.

However, a qubit may include two different physical states classified with the labels of "0" and "1". In this scenario, a quantity of coding a bit state is determined based on the laws of quantum physics. Thus, if a physical quantity of storing the states mechanically operates as a quantum, a quantum information storage device may be additionally located in the superposition between "0" and "1". That is, the qubit may exist in both "0" and "1" states at the same time, and thus, quantum computation with regard to both of the "0" and "1" states may be performed at the same time. Therefore, it may be understood that a qubit having a pure discrete state (0 or 1) is in a classical state and a qubit with a superposition of states is in a quantum state. Accordingly, N qubits may be in a superposition of $2^N$ states.

SUMMARY

Provided are a multi-qubit coupling structures to easily implement a multi-qubit circuit by tuning coupling constants of qubits as desired and a system including the multi-qubit coupling structure.

Additional aspects will be set forth in part in the description which follows and, in part, will be apparent from the description, or may be learned by practice of the presented exemplary embodiments.

According to an aspect of an exemplary embodiment, a multi-qubit coupling structure includes a plurality of qubits, and a variable capacitor electrically connected to the plurality of qubits, wherein the variable capacitor is configured to vary coupling constants of the plurality of qubits.

According to another exemplary embodiment, the plurality of qubits are superconducting qubits formed by using superconducting materials.

According to another exemplary embodiment, the plurality of qubits have a stack structure including a first superconducting material layer, a second superconducting material layer, and a dielectric layer between the first and the second superconducting material layers.

According to another exemplary embodiment, the variable capacitor comprises superconducting materials.

According to another exemplary embodiment, the variable capacitor includes a first planar pattern, a second planar pattern, and an intermediate layer between the first and the second planar patterns, wherein the intermediate layer has a dielectric constant which varies based on an applied voltage.

According to another exemplary embodiment, the intermediate layer is formed of at least one of ferroelectric materials and piezoelectric materials.

According to another exemplary embodiment, the first and the second planar patterns are formed of superconducting materials.

According to another exemplary embodiment, the first planar pattern, the second planar pattern, and the plurality of qubits are formed of the same superconducting materials.

According to another exemplary embodiment, the first and the second planar patterns are formed of superconducting materials.

According to another exemplary embodiment, the variable capacitor is electrically connected to the plurality of qubits via superconducting materials.

According to another exemplary embodiment, the multi-qubit coupling structure further includes an electrode pattern configured to apply a voltage to the intermediate layer of the variable capacitor and the first planar pattern of the variable capacitor, formed on a substrate, a material layer, formed on the substrate, configured to cover the electrode pattern and the first planar pattern, an insulating layer, formed on the material layer, and at least one via-hole of a first via-hole and a second via-hole, wherein the first via-hole is formed in the material layer and the insulating layer and is configured to electrically connect a first qubit and the first planar pattern, and the second via-hole is formed in the insulating layer and is configured to electrically connect a second qubit and the second planar pattern, wherein the second planar pattern is formed on a portion of the material layer which corresponds to the first planar pattern, and a portion of the material layer which corresponds to an intermediate portion between the first and second planar patterns forms the intermediate layer, the plurality of qubits are formed on the insulating layer.

According to another exemplary embodiment, the at least one via-hole is filled with the same superconducting materials as that of the plurality of qubits.

According to another exemplary embodiment, the multi-qubit coupling structure further includes a substrate, and an electrode pattern formed on the substrate in order to apply a voltage to the variable capacitor, wherein the variable capacitor includes a first planar pattern formed on the substrate, an intermediate layer formed on the first planar pattern and having a dielectric constant which varies based on an applied voltage, and a second planar pattern formed on the intermediate layer.

According to another exemplary embodiment, the multi-qubit coupling structure further includes a material layer formed on the substrate in order to cover the electrode pattern and the first planar pattern, wherein a portion of the material layer which corresponds to an intermediate portion between the first and the second planar patterns, forms the intermediate layer.

T According to another exemplary embodiment, the multi-qubit coupling structure further includes an insulating layer formed on the material layer, wherein the plurality of qubits are formed on the insulating layer.

According to another exemplary embodiment, the insulating layer covers the second planar pattern, and the first planar pattern is electrically connected to a first qubit from among the plurality of qubits through a first via-hole formed in the material layer and the insulating layer.

According to another exemplary embodiment, the second planar pattern is electrically connected to a second qubit from among the plurality of qubits via a second via-hole formed in the insulating layer.

According to another exemplary embodiment, the material layer is formed of at least one of ferroelectric materials and piezoelectric materials.

According to another exemplary embodiment, the first and the second planar patterns are formed of superconducting materials.

According to an aspect of an exemplary embodiment, a multi-qubit coupling structure includes a plurality of qubits, and a variable capacitor electrically connected to the plurality of qubits, wherein the variable capacitor is a tunable superconducting capacitor configured to vary coupling constants of the plurality of qubits based on adjustment of a voltage applied to the variable capacitor.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
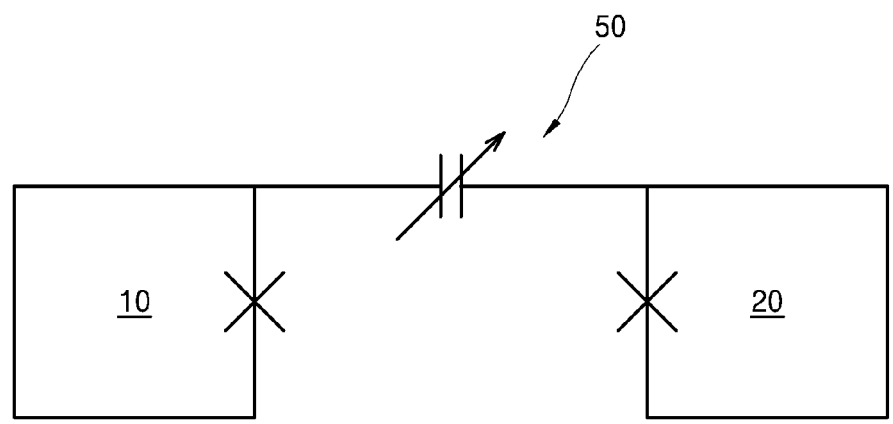
FIG. 1 depicts a conceptual view of a multi-qubit coupling structure, according to an exemplary embodiment.

Hereinafter, a multi-qubit coupling structure and a system including the same will be described with reference to the accompanying drawings. Like reference numerals in the drawings denote like elements. Sizes of components in the drawings may be exaggerated for convenience of explanation. The inventive concept may be embodied in many different forms and should not be construed as being limited to the embodiments set forth herein. It will be understood by those skilled in the art that when a component, such as a layer, a film, a region, or a plate, is referred to as being "on" another component, the component can be directly on the other component or intervening components may be present.

The terms "comprises", "comprising", or any other variations thereof, are intended to cover a non-exclusive inclusion, such that a process or method that comprises a list of steps does not include only those steps but may include other steps not expressly listed or inherent to such process or method. Similarly, one or more devices or sub-systems or elements or structures proceeded by "comprises . . . a" does not, without more constraints, preclude the existence of other devices or other sub-systems or other elements or other structures or additional devices or additional sub-systems or additional elements or additional structures.

Unless otherwise defined, all technical and scientific terms used herein have the same meaning as commonly understood by one of ordinary skill in the art. The system, methods, and examples provided herein are illustrative only and not intended to be limiting.

A qubit, which is a basic unit of quantum computers, may be generated by using a Josephson junction. Qubits may be expanded in a quantum-mechanical manner to form a multi-qubit circuit through coherent coupling. Multi-qubit coupling to form the multi-qubit circuit may be achieved using capacitive coupling or inductive coupling. In inductive coupling, since the multi-qubit coupling takes place near the qubits, a magnetic flux within a qubit structure is changed and a qubit state may be affected by the changed magnetic flux. In capacitive coupling, there is no influence of the magnetic flux and less constrained position, and thus, forming the capacitive coupling is easy. However, it is not easy to generate coupling constants necessary for a desired multi-qubit state by using a fixed capacitor.

In a multi-qubit coupling structure, according to an exemplary embodiment, since a tunable superconducting capacitor is formed between qubits, coupling constants of the qubits may be turned as desired, and thus, a multi-qubit circuit having a desired structure may be easily implemented.

Figure 2:
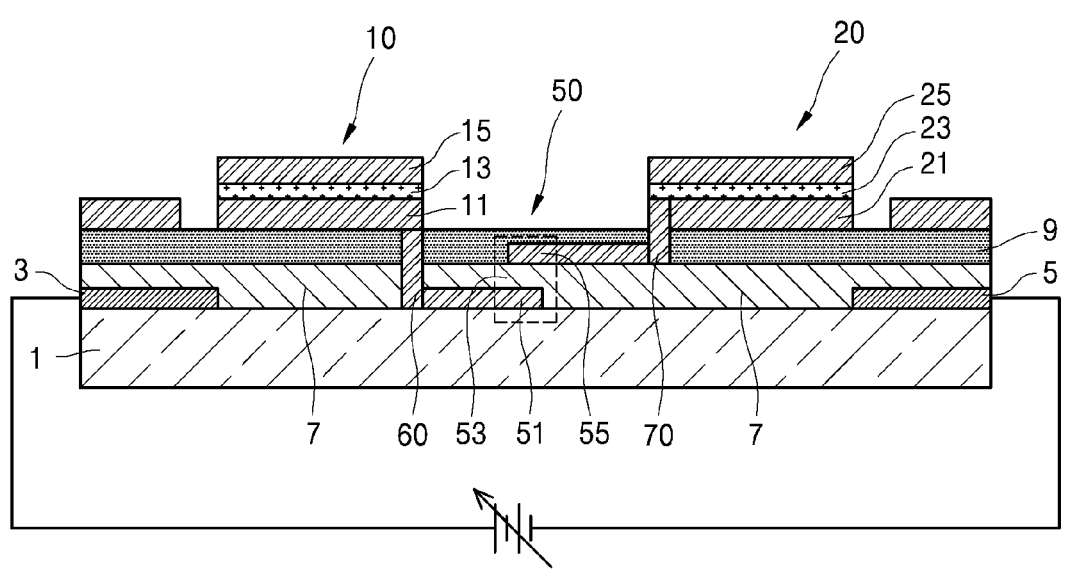
FIG. 2 depicts a schematic cross-sectional view of a multi-qubit coupling structure, according to an exemplary embodiment.

FIG. 1 depicts a conceptual view of a multi-qubit coupling structure, according to an exemplary embodiment, and FIG. 2 depicts a schematic cross-sectional view of a multi-qubit coupling structure, according to an exemplary embodiment.

Referring to FIGS. 1 and 2, the multi-qubit coupling structure may include a plurality of qubits 10 and 20 and a variable capacitor 50 electrically connected between the plurality of the qubits 10 and 20. The variable capacitor 50 may vary coupling constants of the plurality of qubits 10 and 20.

FIGS. 1 and 2 show that the multi-qubit coupling structure includes a pair of qubits 10 and 20 and the variable capacitor 50 electrically connected between the qubits 10 and 20 as an example. However, the embodiment is not limited thereto. The multi-qubit coupling structure may embody various structures, for example, a structure in which three or more qubits are included and a variable capacitor is electrically connected between two qubits is arranged in at least one location.

The qubits 10 and 20 may be superconducting qubits, formed using superconducting materials. For example, as shown in FIG. 2, the qubit 10 may have a stack structure including first and second superconducting material layers 11 and 15 and a dielectric layer 13 between the first and second superconducting material layers 11 and 15, and thus, the qubit 10 may form a Josephson junction. Also, as shown in FIG. 2, the qubit 20 may have a stack structure including first and second superconducting material layers 21 and 25 and a dielectric layer 23 disposed between the first and second superconducting material layers 21 and 25, and thus the qubit 20 may also form a Josephson junction.

The first superconducting material layers 11 and 21 and the second superconducting material layers 15 and 25 may be formed of superconducting materials such as aluminum (Al) and niobium (Nb), according to an exemplary embodiment. The dielectric layers 13 and 23 may include vacant spaces or dielectric materials. A Josephson junction is made by separating two superconductors by non-superconducting materials or a vacant space. Furthermore, cooper pairs may be tunneling in the Josephson junction. The cooper pairs may be electron pairs which are not affected by an electrical resistance within the superconductors and may be in the same quantum state. In addition, the cooper pairs may be expressed by the same wave function, according to an exemplary embodiment.

The variable capacitor 50 may be formed of superconducting materials, according to an exemplary embodiment. The variable capacitor 50 may include first and second planar patterns 51 and 55 and an intermediate layer 53 disposed between the first and second planar patterns 51 and 55 and having a dielectric constant which varies with applied voltages.

The first and second planar patterns 51 and 55 may be formed of conductive materials or of superconducting materials to form a capacitor. For example, at least one of the first and second planar patterns 51 and 55 may be formed of the same superconducting materials as those used to form the qubits 10 and 20.

The intermediate layer 53 is formed of materials having a variable dielectric constant which varies with applied voltages, and thus electric capacity of the variable capacitor 50 may vary based on a voltage change. For example, the intermediate layer 53 may be formed of ferroelectric materials or piezoelectric materials.

Since the intermediate layer 53 is formed of materials having dielectric constant which varies with the applied voltages, the variable capacitor 50 may vary the coupling constants of the qubits 10 and 20 connected to both ends of the variable capacitor 50. That is, the variable capacitor 50 may control the coupling constants between the qubits 10 and 20, wherein the qubit 10 is electrically connected to the first planar pattern 51, and the qubit 20 is electrically connected to the second planar pattern 55.

The multi-qubit coupling structure may be a structure in which the variable capacitor 50 and the qubits 10 and 20 are stacked on a substrate 1. Also, as shown in FIG. 2, the multi-qubit coupling structure may further include electrode patterns 3 and 5 which are formed on the substrate 1 in order to apply a voltage to the variable capacitor 50.

Referring to FIG. 2, the electrode patterns 3 and 5 and the first planar pattern 51 of the variable capacitor 50 may be formed on the substrate 1, and a material layer 7 may be formed on the substrate 1 in order to cover the electrode patterns 3 and 5 and the first planar pattern 51. The second planar pattern 55 may be formed on a portion of the material layer 7 which covers the first planar pattern 51. The intermediate layer 53 may correspond to a portion of the material layer 7 disposed between the first planar pattern 51 and the second planar pattern 55.

FIG. 2 illustrates that the variable capacitor 50 is formed on the substrate 1, and the qubits 10 and 20 are formed on the variable capacitor 50. In such stack structure including the variable capacitor 50 and the qubits 10 and 20, an insulating layer 9 may further be formed between the variable capacitor 50 and the qubits 10 and 20 in order to reduce an unintended interaction between the variable capacitor 50 and the qubits 10 and 20. That is, the insulating layer 9 may be formed on the material layer 7, and the qubits 10 and 20 may be formed on the insulating layer 9. In this case, the insulating layer 9 may be formed of dielectric materials, for example, insulating materials, such as silicon oxide (SiO$_2$) and silicon nitride (SiNx), to make sure the quantum state of the qubits 10 and 20 consisting of cooper pairs is not affected.

The variable capacitor 50 and the qubits 10 and 20 may be stacked on the substrate 1, and the electrode patterns 3 and 5 may be formed on the substrate 1 in order to apply a voltage to the variable capacitor 50.

The substrate 1 may be formed of insulating materials having high heat loss (Q) values in order to minimize an effect on a coherence state of the qubits 10 and 20. For example, the substrate 1 may be a sapphire substrate or a silicon substrate on which an insulating material such as SiO$_2$ and SiNx is formed.

The electrode patterns 3 and 5 may be formed on the substrate 1 by using metallic materials, for example, metallic materials such as gold (Au) and copper (Cu). The variable capacitor 50 may be formed to change the coupling constants of the qubits 10 and 20 according to a change of a voltage applied thereto via the electrode patterns 3 and 5.

The first planar pattern 51 of the variable capacitor 50 may be formed on the substrate 1, on which the electrode patterns 3 and 5 are formed, in order to form the variable capacitor 50. The material layer 7 may be formed on the substrate 1 in order to cover the electrode patterns 3 and 5 and the first planar pattern 51. The second planar pattern 55 of the variable capacitor 50 may be formed on a portion of the material layer 7 which covers the first planar pattern 51. In the stack structure in which the first planar pattern 51, the material layer 7, and the second planar pattern 55 are included, a portion of the material layer 7 which corresponds to an intermediate portion between the first planar pattern 51 and the second planar pattern 55 may be the intermediate layer 53. Therefore, the variable capacitor 50 may include the first and second planar patterns 51 and 55 and the intermediate layer 53 between the first and second planar patterns 51 and 55.

The material layer 7 may be formed of materials having dielectric constants which vary with applied voltages such that the intermediate portion between the first planar pattern 51 and the second planar pattern 55 is used as the intermediate layer 53. For example, the material layer 7 may be formed of ferroelectric or piezoelectric materials.

The insulating layer 9 may be further formed on the material layer 7, and the qubits 10 and 20 may be formed on the insulating layer 9.

The variable capacitor 50 and the qubits 10 and 20 may be electrically connected to each other by using superconducting materials.

For example, in the above stack structure, respective electrical connections between the qubit 10 and the first planar pattern 51 and between the qubit 20 and the second planar pattern 55 may be formed through via holes so that the variable capacitor 50 may be electrically connected to the qubits 10 and 20. A first via-hole (60a of FIG. 9) may be formed in the material layer 7 and the insulating layer 9 for an electrical connection 60 between the qubit 10 and the first planar pattern 51. Also, a second via-hole (70a of FIG. 9) may be formed in the insulating layer 9 for an electrical connection 70 between the qubit 20 and the second planar pattern 55. According to the embodiment, at least one via-hole of the first and second via-holes 60a and 70a hole may be included in the multi-qubit coupling structure, and the electrical connections 60 and 70 may be formed by filling the superconducting materials used to form the qubits 10 and 20 into the at least one via-hole. In the present embodiment, the electrical connections 60 and 70 are formed by filling both of the first and second via-holes 60a and 70a, but the embodiment is not limited thereto. One of the electrical connections may be formed via one of the first and second via-holes 60a and 70a and the other electrical connection may be formed by using another method. In addition, instead of forming via-holes, electrical connections may be formed by using various methods during stacking and patterning processes when the multi-qubit coupling structure is manufactured.

Figure 9:
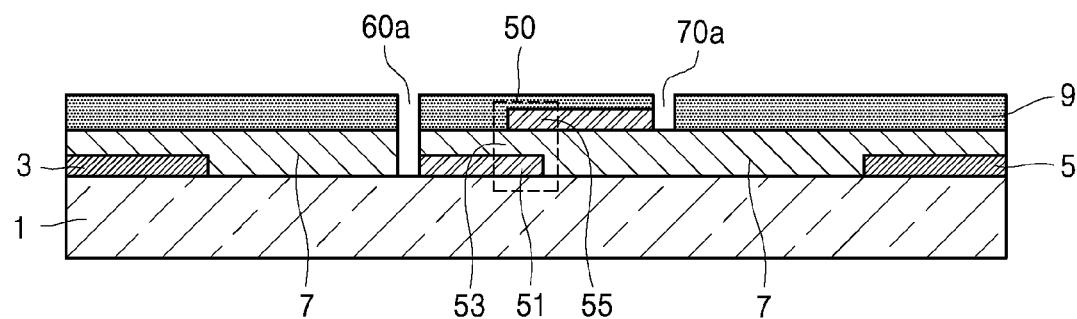

FIGS. 2 and 9 illustrate that the first via-hole 60a is formed in the material layer 7 and the insulating layer 9 for the electrical connection 60 between the qubit 10 and the first planar pattern 51 and that the second via-hole 70a is formed in the insulating layer 9 for the electrical connection 70 between the qubit 20 and the second planar pattern 55. The first and second via-holes 60a and 70a are filled with the superconducting materials used to form the qubits 10 and 20 such that the electrical connections 60 and 70 may be respectively formed between the qubit 10 and the first planar pattern 51 and between the qubit 20 and the second planar pattern 55. The electrical connections 60 and 70 may be formed by filling metallic materials into the first and second via holes 60a and 70a, according to another exemplary embodiment.

FIGS. 3 to 10 depict views for explaining a manufacturing procedure of the multi-qubit coupling structure of FIG. 2, according to an exemplary embodiment.

Figure 3:
FIGS. 3 to 10 depict views illustrating procedures for manufacturing the multi-qubit coupling structure of FIG. 2, according to an exemplary embodiment.

Referring to FIG. 3, first, the substrate 1 is prepared. The substrate 1 may be formed of insulating materials having high Q values in order to minimize an influence on a coherence state of the qubits 10 and 20. For example, the substrate 1 may be a sapphire substrate or a silicon substrate on which an insulating material, such as $SiO_2$ or $SiNx$, is formed.

Figure 4:
Figure 5:
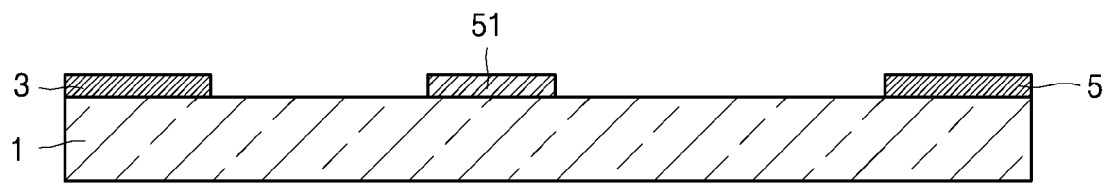

Referring to FIGS. 4 and 5, the electrode patterns 3 and 5, and the first planar pattern 51 of the variable capacitor 50 are formed on the substrate 1. The electrode patterns 3 and 5 may be formed first on the substrate 1, and then the first planar pattern 51 may be added on the substrate 1. Alternatively, after the first planar pattern 51 is formed, the electrode patterns 3 and 5 may be added. The first planar pattern 51 may be separated from the electrode patterns 3 and 5, according to an exemplary embodiment.

The electrode patterns 3 and 5 may be formed of a metallic material such as Au or Cu, in order to apply a voltage to the variable capacitor 50, according to an exemplary embodiment. The first planar pattern 51 may be formed of conductive materials or of superconducting materials so that the first planar pattern 51 comprises a capacitor together with the second planar pattern 55 and the intermediate layer 53. For example, the first planar pattern 51 may be formed of the same superconducting materials as those used to form the qubits 10 and 20.

The electrode patterns 3 and 5 and the first planar pattern 51 may be formed of the same metallic materials, and in this case, the electrode patterns 3 and 5 and the first planar pattern 51 may be simultaneously formed on the substrate 1, according to another exemplary embodiment.

Figure 6:
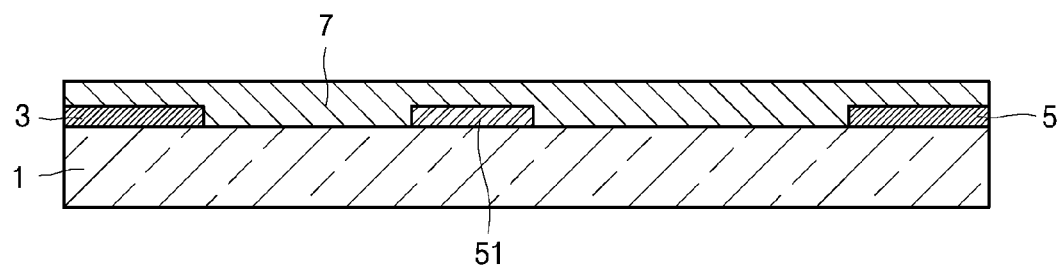

As shown in FIG. 6, the material layer 7 may be formed on the substrate 1 in order to cover the electrode patterns 3 and 5 and the first planar pattern 51. A portion of the material layer 7 which corresponds to an intermediate portion between the first planar pattern 51 and the second planar pattern 55 may be the intermediate layer 53 of the variable capacitor 50. The material layer 7 may be formed of materials having dielectric constants which vary based on an applied voltage. For example, the material layer 7 may be formed of ferroelectric materials or piezoelectric materials.

Figure 7:
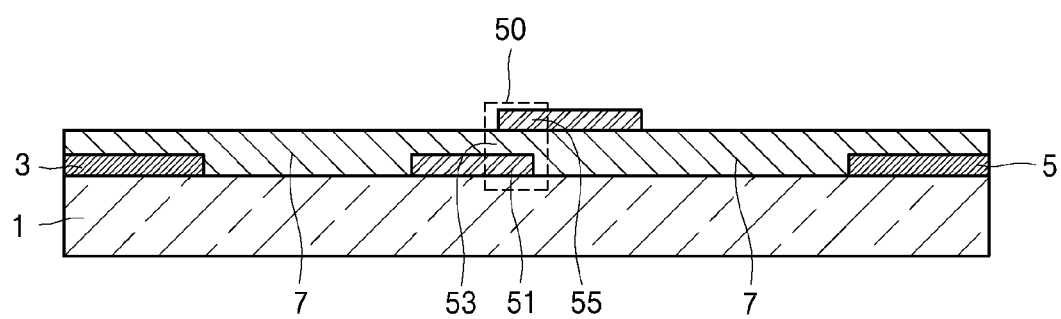

As shown in FIG. 7, the second planar pattern 55 may be formed on a portion of the material layer 7 which covers the first planar pattern 51 so as to form the variable capacitor 50. The portion of the material layer 7 which corresponds to the intermediate portion between the first planar pattern 51 and the second planar pattern 55 may be the intermediate layer 53. The second planar pattern 55 may be formed of conductive materials or of superconducting materials, so that the second planar pattern 55 may comprise a capacitor together with the first planar pattern 51 and the intermediate layer 53. For example, the second planar pattern 55 may be formed of the same superconducting materials as those used to form the qubits 10 and 20. The second planar pattern 55 may be formed of the same materials as or different materials from the first planar pattern 51.

Figure 8:
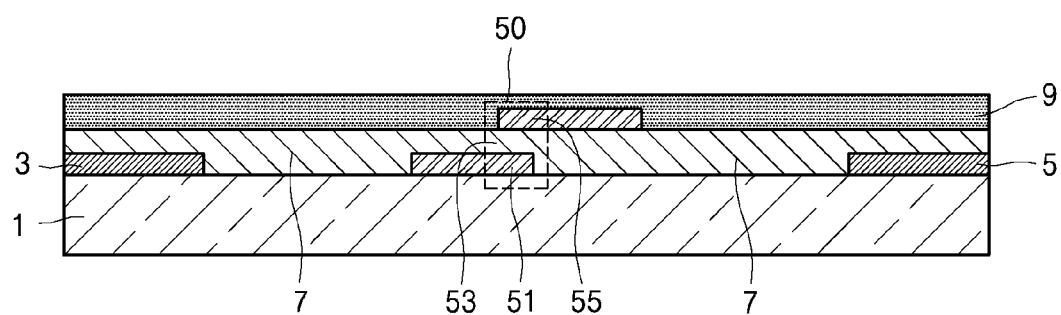

While the variable capacitor 50 is being formed by forming the second planar pattern 55, the insulating layer 9 may be formed on the material layer 7 to cover the second planar pattern 55 as shown in FIG. 8. Then, as shown in FIG. 9, the first via-hole 60a is formed in the insulating layer 9 and the material layer 7 to reach the first planar pattern 51, and the second via-hole 70a is formed in the insulating layer 9 to reach second planar pattern 55.

Figure 10:
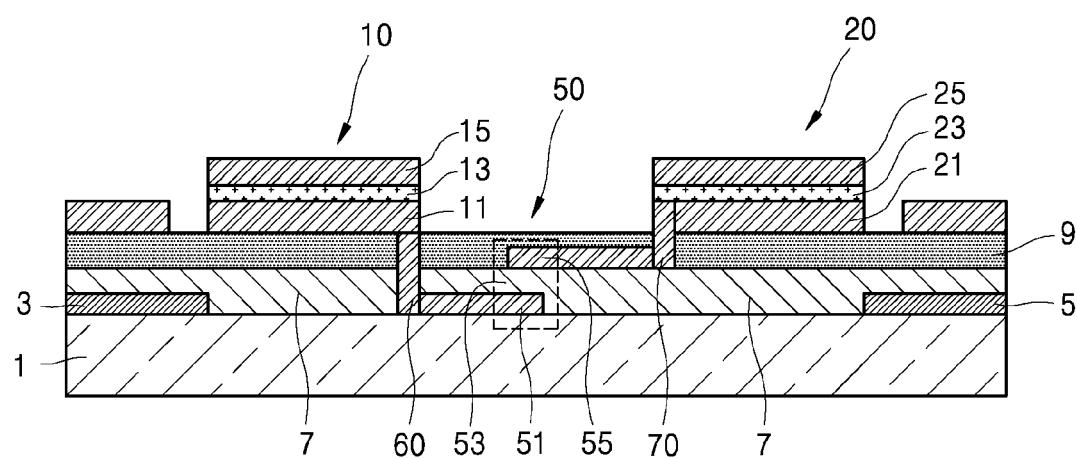

As shown in FIG. 10, the first via-hole 60a and the second via-hole 70a may be filled with conductive materials in order to form the electrical connections 60 and 70 between the qubit 10 and the first planar pattern 51 and between the qubit 20 and the second planar pattern 55 respectively. Following that, the plurality of qubits 10 and 20 may be formed on the insulating layer 9. As a result, the multi-qubit coupling structure may be obtained.

As described above, in the multi-qubit coupling structure according to the one or more of the above embodiments, a coupling between the qubits 10 and 20 may be controlled by using the variable capacitor 50, that is, a tunable superconducting capacitor, instead of using a fixed capacitor.

As described above, in the multi-qubit coupling structure according to the one or more of the above embodiments, when a voltage applied to the variable capacitor 50 is adjusted, coupling constants of the qubits 10 and 20 may be controlled. Since the variable capacitor 50 is used, coupling constants necessary for a multi-qubit state may be easily acquired without any influence of a magnetic flux or limitation on locations. Also, a multi-qubit circuit having a desired structure may be easily implemented by frequently tuning the coupling constants of the qubits 10 and 20 according to necessity.

According to a multi-qubit coupling structure according to an embodiment, the capacitor which is connected between qubits may be formed to have the intermediate layer having the dielectric constant which varies with the applied voltage, and thus, a desired multi-qubit circuit may be easily implemented by tuning the coupling constants of the plurality of qubits according to necessity.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component of any or all the claims.

While specific language has been used to describe the disclosure, any limitations arising on account of the same are not intended. As would be apparent to a person in the art, various working modifications may be made to the method in order to implement the inventive concept as taught herein.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

What is claimed is:

1. A multi-qubit coupling structure comprising:
a plurality of qubits;
a variable capacitor electrically connected to the plurality of qubits;
a substrate; and
an electrode pattern formed on the substrate to apply a voltage to the variable capacitor,
wherein the variable capacitor is configured to vary coupling constants of the plurality of qubits,
wherein the variable capacitor comprises:
a first planar pattern formed on the substrate;
an intermediate layer formed on the first planar pattern and having a dielectric constant which varies based on an applied voltage; and
a second planar pattern formed on the intermediate layer,
wherein the multi-qubit coupling structure further comprises a material layer formed on the substrate to cover the electrode pattern and the first planar pattern, and
wherein a portion of the material layer, which corresponds to an intermediate portion between the first and the second planar patterns, forms the intermediate layer.

2. The multi-qubit coupling structure of claim 1, wherein the plurality of qubits are superconducting qubits formed by using superconducting materials.

3. The multi-qubit coupling structure of claim 2, wherein the plurality of qubits have a stack structure comprising:
a first superconducting material layer;
a second superconducting material layer; and
a dielectric layer between the first and the second superconducting material layers.

4. The multi-qubit coupling structure of claim 1, wherein the variable capacitor comprises superconducting materials.

5. The multi-qubit coupling structure of claim 1, wherein the intermediate layer is formed of at least one of ferroelectric materials and piezoelectric materials.

6. The multi-qubit coupling structure of claim 5, wherein the first and the second planar patterns are formed of superconducting materials.

7. The multi-qubit coupling structure of claim 6, wherein the first planar pattern, the second planar pattern, and the plurality of qubits are formed of the same superconducting materials.

8. The multi-qubit coupling structure of claim 1, wherein the first and the second planar patterns are formed of superconducting materials.

9. The multi-qubit coupling structure of claim 8, wherein the first planar pattern, the second planar pattern, and the plurality of qubits are formed of the same superconducting materials.

10. The multi-qubit coupling structure of claim 1, wherein the variable capacitor is electrically connected to the plurality of qubits via superconducting materials.

11. The multi-qubit coupling structure of claim 1, further comprising an insulating layer formed on the material layer, wherein the plurality of qubits are formed on the insulating layer.

12. The multi-qubit coupling structure of claim 11, wherein the insulating layer covers the second planar pattern, and
the first planar pattern is electrically connected to a first qubit from among the plurality of qubits through a first via-hole formed in the material layer and the insulating layer.

13. The multi-qubit coupling structure of claim 12, wherein the second planar pattern is electrically connected to a second qubit from among the plurality of qubits via a second via-hole formed in the insulating layer.

14. The multi-qubit coupling structure of claim 1, wherein the material layer is formed of at least one of ferroelectric materials and piezoelectric materials, and the first and the second planar patterns are formed of superconducting materials.

15. A multi-qubit coupling structure comprising:
a plurality of qubits;
a variable capacitor electrically connected to the plurality of qubits,
a substrate; and
an electrode pattern formed on the substrate to apply a voltage to the variable capacitor,
wherein the variable capacitor is a tunable superconducting capacitor configured to vary coupling constants of the plurality of qubits based on adjustment of a voltage applied to the variable capacitor,
wherein the variable capacitor comprises:
a first planar pattern formed on the substrate;
an intermediate layer formed on the first planar pattern and having a dielectric constant which varies based on an applied voltage; and
a second planar pattern formed on the intermediate layer,
wherein the multi-qubit coupling structure further comprises a material layer formed on the substrate to cover the electrode pattern and the first planar pattern, and
wherein a portion of the material layer, which corresponds to an intermediate portion between the first and the second planar patterns, forms the intermediate layer.

* * * * *